(12) United States Patent
Shylo et al.

(10) Patent No.: US 8,324,797 B2
(45) Date of Patent: Dec. 4, 2012

(54) WHITE LIGHT EMITTING DIODE AND METHOD OF MANUFACTURING THE SAME

(75) Inventors: Sergiy Shylo, Gyeonggi-do (KR); Dong Ik Shin, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 144 days.

(21) Appl. No.: 12/068,998

(22) Filed: Feb. 14, 2008

(65) Prior Publication Data

US 2009/0153023 A1    Jun. 18, 2009

(30) Foreign Application Priority Data

Dec. 17, 2007 (KR) .................. 10-2007-0132469

(51) Int. Cl.
*H01J 1/62* (2006.01)
*H01J 9/02* (2006.01)
(52) U.S. Cl. ............. 313/503; 313/504; 257/98; 257/99
(58) Field of Classification Search .......... 313/484–487, 313/489, 498, 512, 467, 468, 499.501–503; 257/98–100, 79–81; 362/235, 227, 231, 362/293, 545, 800; 345/44, 46; 438/22, 438/26, 458
See application file for complete search history.

(56) References Cited

U.S. PATENT DOCUMENTS

| 2003/0089914 | A1  | 5/2003  | Chen |
|2006/0234409 | A1* | 10/2006 | Nagai et al. ............... 438/26 |
| 2007/0012940 | A1* | 1/2007  | Suh et al. .................. 257/99 |
| 2007/0160745 | A1  | 7/2007  | Park |
| 2009/0315013 | A1* | 12/2009 | Tansu et al. ............... 257/13 |

FOREIGN PATENT DOCUMENTS

| JP | 2005191197 A | * | 7/2005 |
| KR | 10-2006-0055934 |   | 5/2006 |
| KR | 1020060055934 | * | 5/2006 |

OTHER PUBLICATIONS

US Office Action issued in U.S. Appl. No. 13/354,837 issued on Jun. 6, 2012.

* cited by examiner

*Primary Examiner* — Anh Mai
*Assistant Examiner* — Elmito Breval
(74) *Attorney, Agent, or Firm* — McDermott Will & Emery LLP

(57) ABSTRACT

Provided is a white LED including a reflector cup; an LED chip mounted on the bottom surface of the reflector cup; transparent resin surrounding the LED chip; a phosphor layer formed on the transparent resin; and a light transmitting layer that is inserted into the surface of the phosphor layer so as to form an embossing pattern on the surface, the light transmitting layer transmitting light, incident from the phosphor layer, in the upward direction.

8 Claims, 8 Drawing Sheets

100

WHITE LIGHT EMITTING DIODE AND METHOD OF MANUFACTURING THE SAME

CROSS-REFERENCE TO RELATED APPLICATIONS

This application claims the benefit of Korean Patent Application No. 10-2007-0132469 filed with the Korea Intellectual Property Office on Dec. 17, 2007, the disclosure of which is incorporated herein by reference.

BACKGROUND OF THE INVENTION

1. Field of the Invention

The present invention relates to a white light emitting diode (LED) and a method of manufacturing the same.

2. Description of the Related Art

An LED is referred to as a device which generates minority carriers (electrons or holes) injected by using the p-n junction structure of semiconductor and emits light by recombining the minority carriers. As for the LED, a red LED using GaAsP or the like, a green LED using GaP or the like, and a blue LED using InGaN/AlGaN double hetero structure are provided.

The LED has low power consumption and a long lifespan. Further, the LED can be installed in a narrow space, and has high resistance to vibration. The LED is used as a display device and a backlight unit. Recently, researches are being actively conducted to apply the LED as a general lighting.

Recently, white LEDs as well as red, blue, or green LEDs are launched on the market.

Since the white LEDs can be applied to various fields, it is expected that demand for the white LEDs is rapidly increasing.

A technique for implementing white light in the LED can be roughly divided into two techniques.

In the first technique, red, green, and blue LED chips are installed adjacent to each other, and lights emitted from the respective LED chips are mixed to implement white light. However, since the respective LED chips have different thermal or time characteristics, the color tones of the LED chips are changed depending on the surrounding environment. In particular, color spots may occur, which makes it difficult to implement a uniform mixed color.

In the second technique, phosphor is disposed in an LED chip. Some of primarily-emitted light from the LED chip and secondarily-emitted light, of which the wavelength is converted by the phosphor, are mixed to implement white light. That is, phosphor which is excited by ultraviolet (UV) light so as to emit visible light from blue to red is coated on the LED chip which emits UV light, thereby obtaining white light. Alternately, on an LED chip which emits blue light, phosphor is distributed, the phosphor emitting yellow-green or yellow light by using the blue light as an excitation source. Then, white light can be obtained by the blue light emitted from the LED chip and the yellow-green or yellow light emitted from the phosphor.

Between them, the second technique is generally used. In particular, the technique for implementing white light by using the blue LED chip and the yellow-green or yellow phosphor is most frequently used.

FIG. 1 is a cross-sectional view of a conventional lamp-type white LED which uses a white LED chip and yellow light emitting phosphor so as to implement white light.

As shown in FIG. 1, the lamp-type white LED 10 includes a mount lead 11, an inner lead 12, and an LED chip 14 installed in a reflector cup 20 formed in the upper portion of the mount lead 11. Further, n- and p-electrodes of the LED chip 14 are electrically connected to the mount lead 11 and the inner lead 12, respectively, through a wire 15.

The LED chip 14 is covered by a phosphor layer 150 which is obtained by mixing phosphor materials with transparent resin. The above-described components are surrounded by an encapsulation member 17.

The reflector cup 20 is coated with silver (Ag) and aluminum (Al) to reliably reflect visible light.

FIGS. 2A and 2B are diagrams simply showing a case where phosphor materials are disposed in the reflector cup.

As shown in the drawings, the LED chip 14 is mounted on the bottom surface of the reflector cup 20, and the transparent resin 16 is filled in the reflector cup 20. Further, the phosphor materials 19 are distributed in the transparent resin 16.

As shown in FIG. 2A, the phosphor materials 19 may be uniformly distributed in the transparent resin 16. Alternately, as shown in FIG. 2B, the phosphor materials 19 may be concentrated on the surface of the LED chip 14.

When a current is applied, the LED 10 including the phosphor materials 19 mixed with the transparent resin 16 implements white light by combining blue light emitted from the LED chip 14 and yellow light emitted from the phosphor materials 16 using some of the blue light as an excitation source.

However, some of light emitted from the phosphor materials 19, which are excited by the light emitted from the LED chip 14, collides with the surface of the LED chip 14 so as to be re-absorbed. Therefore, light emission efficiency decreases.

As shown in FIG. 2B, when the phosphor materials 19 are concentrated on the surface of the LED chip 14, it is highly likely that the light emitted from the phosphor materials 19 collides with the surface of the LED chip 14, compared with the case where the phosphor materials 19 are uniformly distributed in the transparent resin 16. Therefore, the light emission characteristic is degraded.

SUMMARY OF THE INVENTION

An advantage of the present invention is that it provides a white LED in which only transparent resin is filled around an LED chip mounted on the bottom surface of a reflector cup, a phosphor layer is formed on the transparent resin, and spherical particles are inserted into the surface of the phosphor layer such that an embossing pattern is provided on the surface. In the white LED, light directed from the phosphor layer toward the LED chip is transmitted upward, thereby enhancing light extraction efficiency.

Another advantage of the invention is that is provides a method of manufacturing a white LED.

Additional aspects and advantages of the present general inventive concept will be set forth in part in the description which follows and, in part, will be obvious from the description, or may be learned by practice of the general inventive concept.

According to an aspect of the invention, a white LED comprises a reflector cup; an LED chip mounted on the bottom surface of the reflector cup; transparent resin surrounding the LED chip; a phosphor layer formed on the transparent resin; and a light transmitting layer that is inserted into the surface of the phosphor layer so as to form an embossing pattern on the surface, the light transmitting layer transmitting light, incident from the phosphor layer, in the upward direction.

The transparent resin may be selected from the group consisting of polymethly methacrylate (PMMA), polysterene, polyurethane, benzoguanamine resin, epoxy, and silicon resin.

The phosphor layer may be formed by mixing transparent resin and phosphor materials. In this case, the transparent resin may be selected from the group consisting of PMMA, polysterene, polyurethane, benzoguanamine resin, epoxy, and silicon resin.

Preferably, the light transmitting layer has the same refractive index as that of the transparent resin. In this case, the transparent resin may be selected from the group consisting of PMMA, polysterene, polyurethane, benzoguanamine resin, epoxy, and silicon resin.

The light transmitting layer may be formed of a plurality of spherical particles, and the diameters of the spherical particles range from 5 to 100 μm.

The LED chip may include at least one or more LEDs which generate blue, red, green, and ultraviolet (UV) wavelengths. Further, the phosphor layer may include at least one or more phosphor materials which convert a wavelength into any one of yellow, red, and green.

According to another aspect of the invention, a white LED comprises a reflector cup that is inclined upward; an LED chip that is mounted on the bottom surface of the reflector cup; a molding compound that is filled in the reflector cup so as to surround the LED chip; a phosphor layer that is formed on the molding compound; and a light transmitting layer that is formed by inserting a plurality of spherical particles into the surface of the phosphor layer such that an embossing pattern is formed on the surface. A ratio of the radius of the spherical particles to the height of the embossing pattern from the surface of the phosphor layer ranges from 0.6 to 1.

Preferably, the diameters of the spherical particles composing the light transmitting layer range from 5 to 100 μm, and the light transmitting layer has the same refractive index as that of the molding compound.

The light transmitting layer may be formed of any one selected from the group consisting of PMMA, polysterene, polyurethane, benzoguanamine resin, epoxy, and silicon resin.

According to a further aspect of the invention, a method of manufacturing a white LED comprises the steps of: preparing a reflector cup; mounting an LED chip on the bottom surface of the reflector cup; forming a molding compound in the reflector cup such that the LED chip is surrounded by the molding compound; forming a phosphor layer on the molding compound; and forming a light transmitting layer by inserting a plurality of spherical particles into the phosphor layer such that an embossing pattern is formed on the surface of the phosphor layer.

The molding compound may be formed of any one selected from the group consisting of PMMA, polysterene, polyurethane, benzoguanamine resin, epoxy, and silicon resin.

The forming of the phosphor layer may include the steps of: mixing transparent resin with phosphor materials, and then dispensing the transparent resin and the phosphor materials on the molding compound; and semi-curing the transparent resin and the phosphor materials dispensed on the molding compound.

The forming of the light transmitting layer may include the steps of: semi-curing the phosphor layer; preparing a container in which spherical-particle powder is stored; preparing a support bar having a sheet for bonding the spherical-particle powder, the sheet being attached to the lower surface of the support bar; putting the sheet into the container such that the spherical-particle powder is bonded to the surface of the sheet; placing the sheet having the spherical-particle powder bonded thereon onto the semi-cured phosphor layer, and applying pressure to insert the spherical particles into the phosphor layer; and separating the support bar from the phosphor layer.

The method may further include the step of completely curing the phosphor layer after the spherical particles are inserted into the phosphor layer. Preferably, the diameters of the spherical particles range from 5 to 100 μm.

Preferably, a ratio of the radius of the spherical particles to the height of the embossing pattern from the surface of the phosphor layer ranges from 0.6 to 1.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
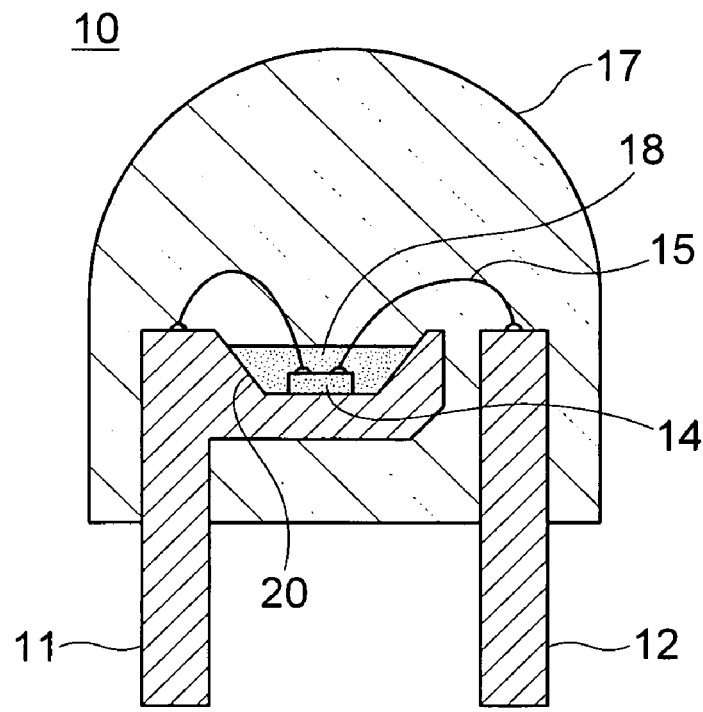
FIG. 1 is a cross-sectional view of a conventional lamp-type white LED.
Figure 2A:
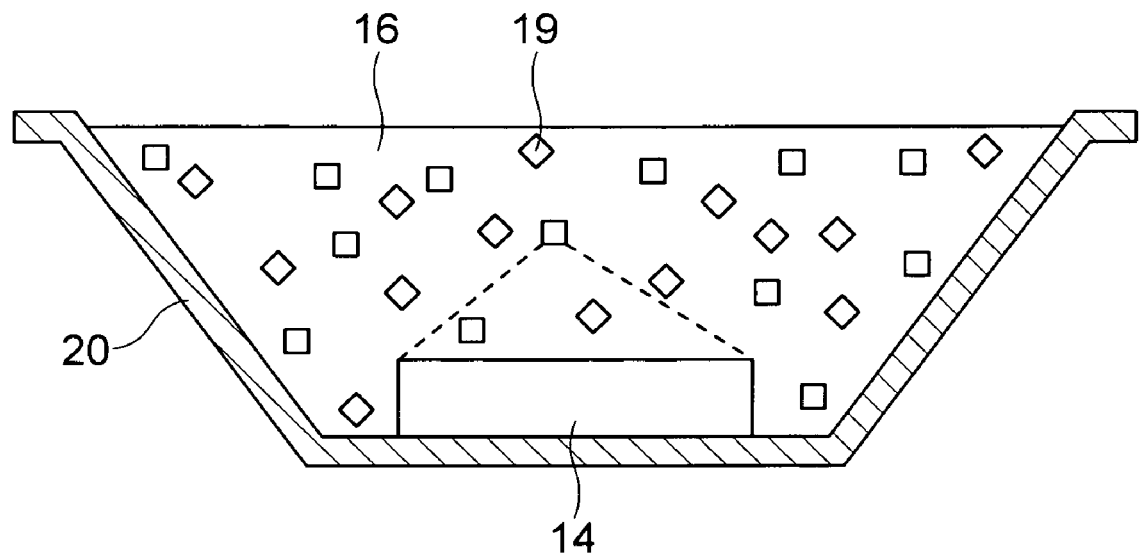
FIGS. 2A and 2B are diagrams simply showing a case where phosphor materials are distributed in a reflector cup of the conventional lamp-type white LED.
Figure 2B:
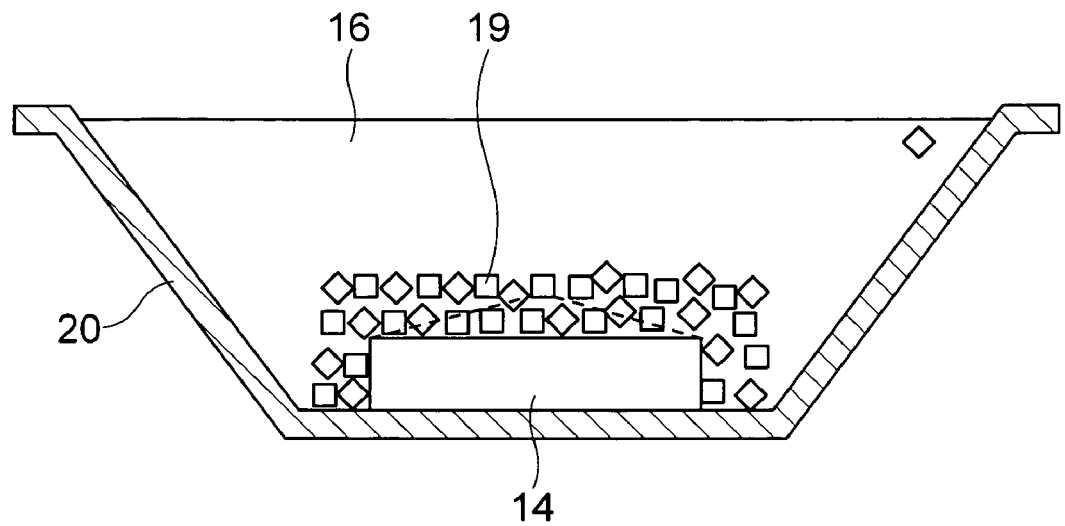

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a white LED and a method of manufacturing the same according to the present invention will be described in detail with reference to the accompanying drawings.

Figure 3:
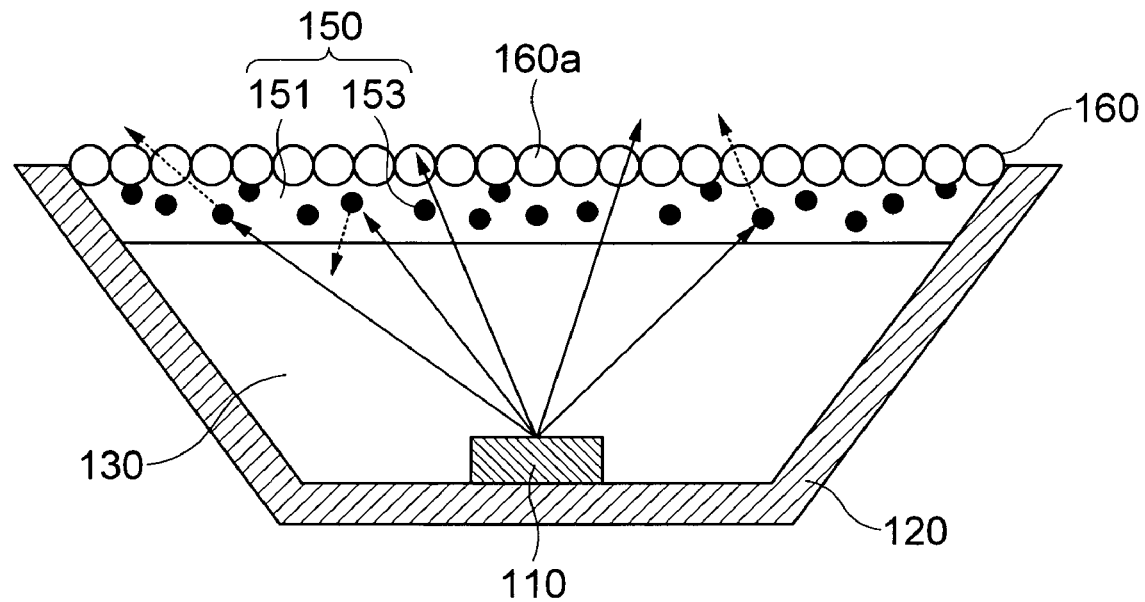
FIG. 3 is a cross-sectional view of a white LED according to the invention.

FIG. 3 is a cross-sectional view of a white LED according to the invention, showing a state where an LED chip is mounted on a reflector cup.

As shown in FIG. 3, the white LED 100 according to the invention includes a reflector cup 120, an LED chip 110 mounted on the bottom surface of the reflector cup 120, a molding compound 130 surrounding the LED chip 110, a phosphor layer 150 formed on the molding compound 130, and a light transmitting layer 160 formed on the phosphor layer 150.

The reflector cup 120 has a structure that is inclined upward. The inner wall of the reflector cup 120 is coated with a reflective material for reflecting light which is emitted from the LED chip 110 and is then directed to a side portion or lower portion of the reflector cup 120.

As for the reflective material, silver (Ag), aluminum (Al) and so on may be used, which have an excellent reflective property with respect to visible light.

The LED chip 110 may include one or more LEDs which generate blue, red, green and ultraviolet (UV) wavelengths. For example, the LED chip 110 may include only a blue LED or both blue and red LEDs.

However, the present invention is not limited to such examples. If blue, red, green and ultraviolet (UV) wavelengths can be generated, an LED can be independently used or another combination of LEDs can be used.

The molding compound 130, which is filled in the reflector cup 120 so as to surround the LED chip 110, is composed of transparent resin which can transmit visible light generated from the LED chip 110. For example, the molding compound 130 may be formed of any one of polymethly methacrylate (PMMA), polysterene, polyurethane, benzoguanamine resin, epoxy, and silicon resin.

The phosphor layer 150 is formed by mixing phosphor materials 153 with transparent resin 151. A material for forming the transparent resin 151 is not specifically limited, if the material can transmit light generated from the LED chip 110 and light emitted from the phosphor materials 153 and can stably disperse the phosphor materials 153. For example, the transparent resin 151 may be formed of any one of PMMA, polysterene, polyurethane, benzoguanamine resin, epoxy, and silicon resin, like the molding compound 130.

The phosphor materials 153 may be formed of phosphor which converts a wavelength into any one of yellow, red, and green. The phosphor materials 153 of the phosphor layer 150 are determined depending on the emission wavelength of the LED chip 110. That is, phosphor materials are used, which can convert light emitted from the LED chip 110 so as to implement white light. For example, when the LED chip 110 generates blue light, the phosphor layer 150 is formed of a phosphor material which can emit yellow light.

As such, when the blue LED and the yellow light emitting phosphor are used, blue light emitted from the LED chip 110 and yellow light emitted from the phosphor materials using some of the blue light as an excitation source are combined at the time of the application of current, thereby implementing white light.

The light transmitting layer 160 is formed by inserting a plurality of spherical particles 160a into the surface of the phosphor layer 150, the spherical particles 160a forming an embossing pattern on the surface.

Further, the spherical particles 160a forming the light transmitting layer 160 have the same refractive index as the molding compound 130 and may be formed of any one of PMMA, polysterene, polyurethane, benzoguanamine resin, epoxy, and silicon resin.

The light emitting layer 160 forming the spherical embossing pattern on the surface of the phosphor layer 150 transmits light generated from the LED chip 110 and refracts phosphorescence of the phosphor layer 150, which is directed downward, to the upper direction such that the phosphorescence is transmitted. Therefore, light extraction efficiency is enhanced.

Refraction is referred to as a phenomenon in which when light is incident on a different transparent medium, the light does not enter the medium straightly, but is bent and then propagates straightly. A refractive index indicates how much light is bent when the light enters a medium. A refractive index determined in a vacuum state is referred to as an absolute refractive index. The absolute refractive index is usually called a refractive index.

For example, when the speed of light in the vacuum is represented by C and the speed of light in a medium is represented by V, a refractive index can be expressed by Equation 1.

$$\text{Refractive Index } n = C/V \qquad \text{[Equation 1]}$$

Therefore, the refractive index in the vacuum state is 1. Since the speed (V) of light in a medium is smaller than the speed (C) of light in the vacuum, a refractive index is always larger than 1.

Meanwhile, a predetermined rule for refraction in a certain medium is established between an incident angle and a refraction angle. This is referred to as the Snell's law.

When a medium has a large refractive index, it indicates that the medium is an optically dense medium. Further, the speed of light in the medium becomes low. On the contrary, when a medium has a small refractive index, it indicates that the medium is an optically thin medium. Such terms are relatively used at all times.

Figure 4:
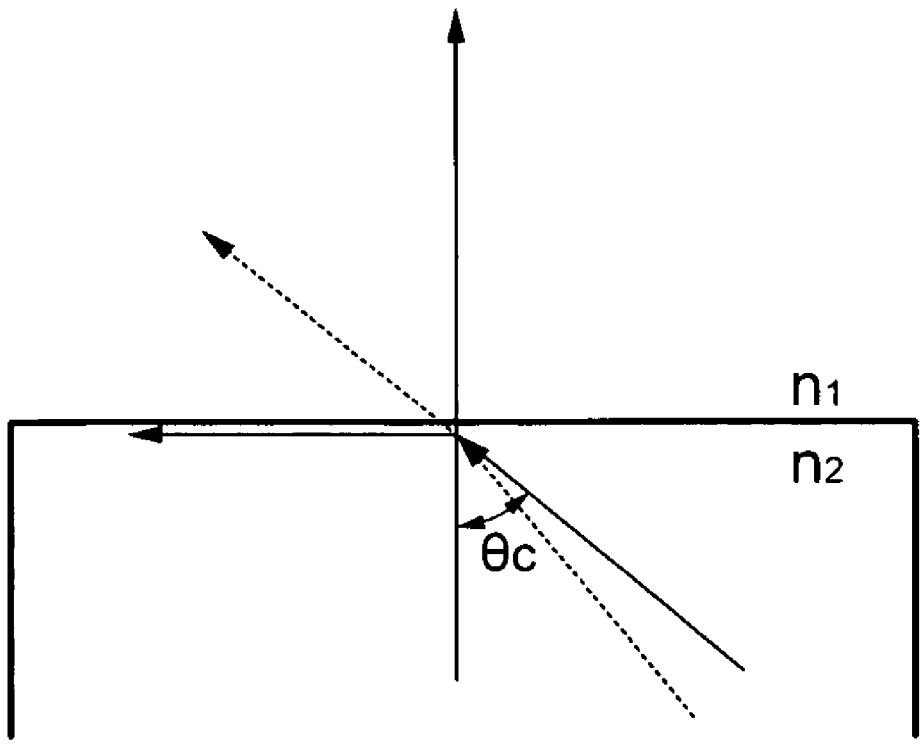
FIGS. 4 and 5 are conceptual diagrams for explaining the Snell's law which is applied to the invention.
Figure 5:
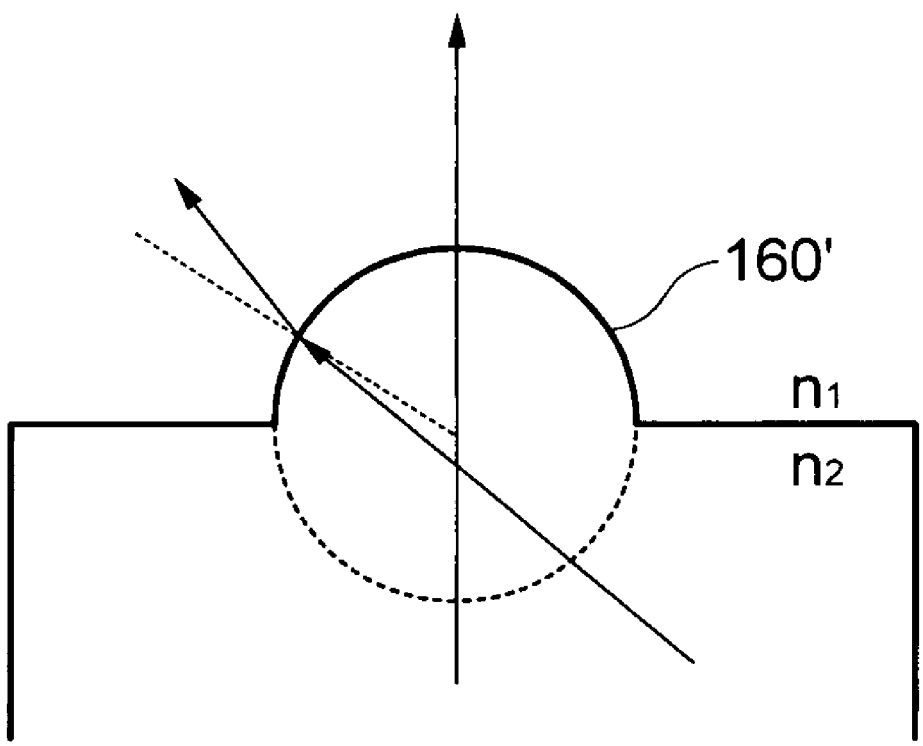

FIGS. 4 and 5 are conceptual diagrams for explaining the Snell's law which is applied to the invention. FIG. 4 shows a case where an interface between two media is flat, and FIG. 5 shows a case where an interface between two media is formed in a hemispherical shape.

As shown in FIG. 4, when light is incident from an optically dense medium n2 to an optically thin medium n1, the speed of the light in the optically thin medium n1 becomes so high that the propagation direction of the light is bent toward a direction away from a vertical line.

Meanwhile, when light is incident at more than a predetermined angle, the light is not refracted at a flat interface, but is reflected. Such a phenomenon is referred to as total reflection (which is represented by a dashed line in FIG. 4). An angle at which the total reflection occurs is referred to as a critical angle $\theta_c$. As a difference in refractive index between two media increases, the critical angle $\theta_c$ decreases. Then, the total reflection of incident light frequently occurs.

Therefore, to reduce the total reflection, the critical angle at the interface should be increased. In the invention, the interface between two different media is formed in a hemispherical shape so as to increase the critical angle.

That is, as shown in FIG. 5, when a hemispherical pattern 160' is provided at the interface between two media, most of light incident on the optically thin medium n1 from the optically dense medium n2 can be transmitted without total reflection.

The present invention takes advantage of such an optical characteristic. The light transmitting layer 160 is formed by inserting the spherical particles 160a into the surface of the phosphor layer 150 such that the embossing pattern is formed on the surface. Therefore, it is possible to prevent light, incident from the phosphor layer 150, from being totally reflected at the interface.

Figure 6:
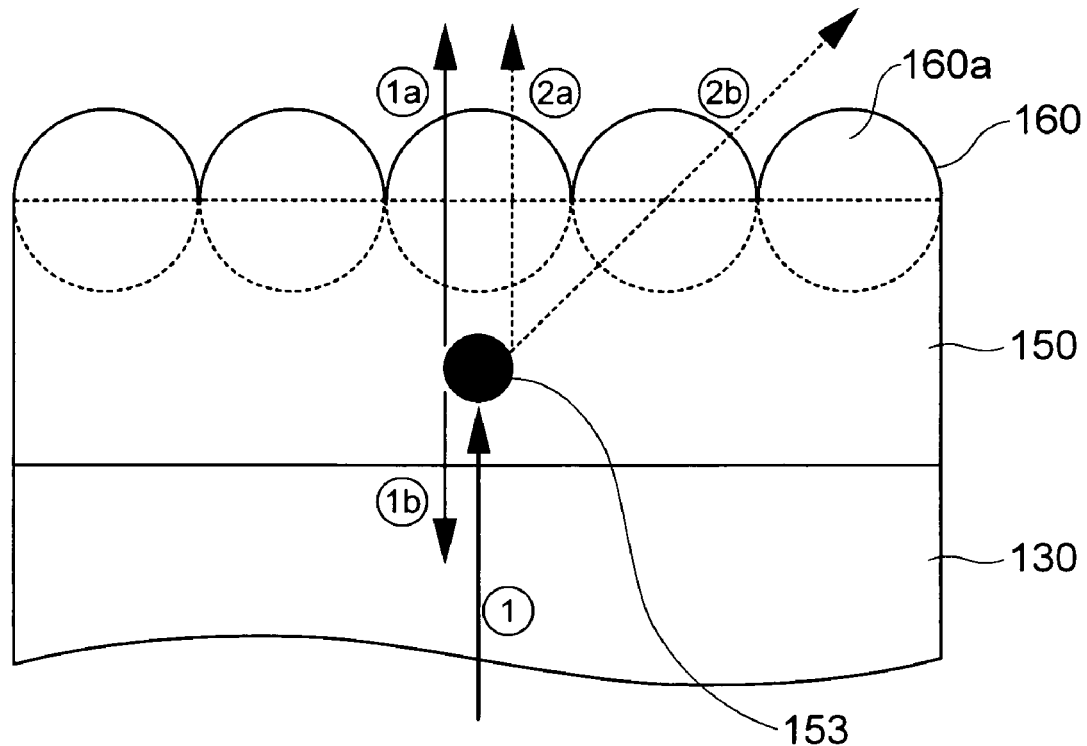
FIG. 6 is a diagram showing light extraction of the white LED according to the invention.

More specifically, as shown in FIG. 6, when blue light (1) is emitted from the LED chip (not shown) positioned under the phosphor layer 150, the blue light (1) collides with the phosphor materials 153 so as to excite the phosphor materials 153 distributed in the phosphor layer 150 and are then discharged upward (1a) or directed downward (1b). At this time, most of the blue light excites the phosphor material 153 and are then discharged upward. Further, most of the light incident in the downward direction is reflected by the reflector cup so as to again excite the phosphor materials 153 and is then discharged upward.

The phosphor materials 153 excited by the blue light (1) generate yellow light (2a and 2b). In this case, most of the yellow light (2a and 2b) is discharged upward with the blue light (1a) without being totally reflected, thereby implementing white light.

As such, most of light is transmitted to the outside by the light transmitting layer 160 formed of the spherical particles 160a, without being totally reflected. That is, when the light transmitting layer 160 is not provided on the phosphor layer 150, light incident at a larger angle than the critical angle is totally reflected at the flat interface. However, as the critical angle is increased to almost 90 degrees by the light transmitting layer 160, most of light incident from the phosphor layer 150 to the outside is transmitted without total reflection.

Meanwhile, the diameter of the spherical particles 160a can set in the range of 5 to 100 µm, and the size of the spherical particles 160a has an effect upon light transmittance depending on wavelengths.

Figure 7:
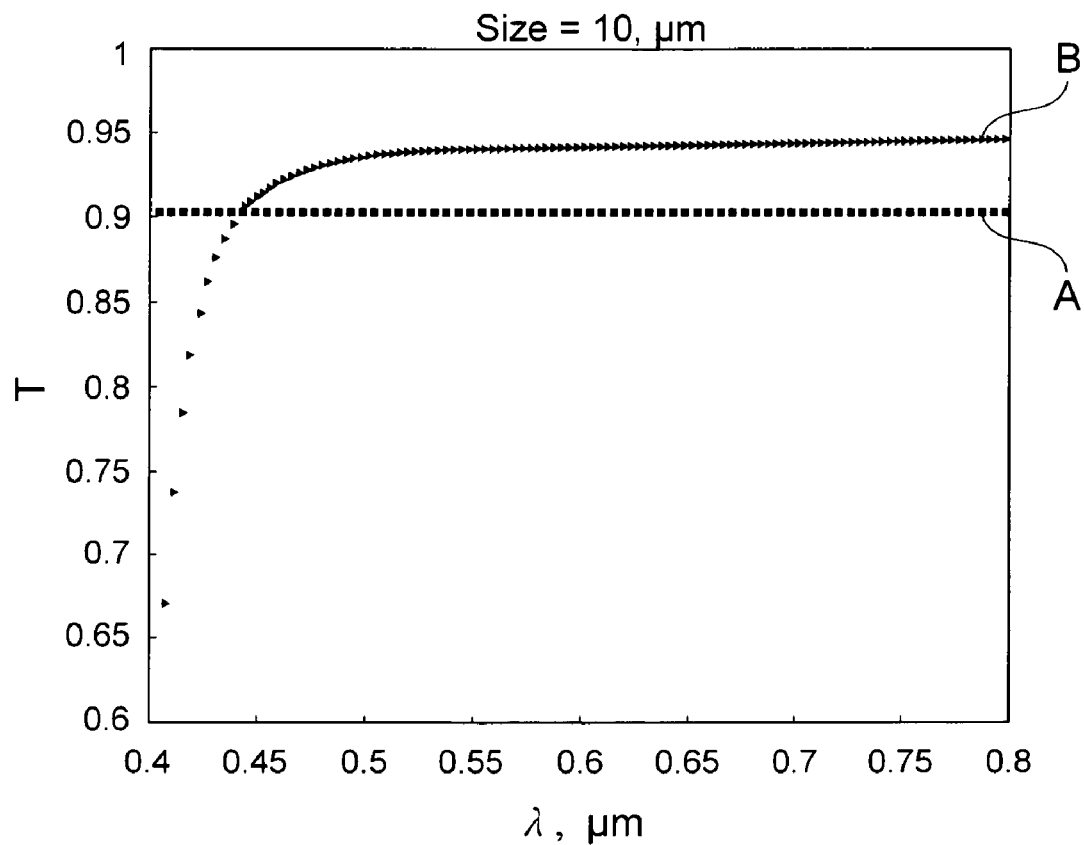
FIG. 7 is a graph showing light transmittance depending on wavelengths in a case where the size of spherical particles is set to 10 μm.
Figure 8:
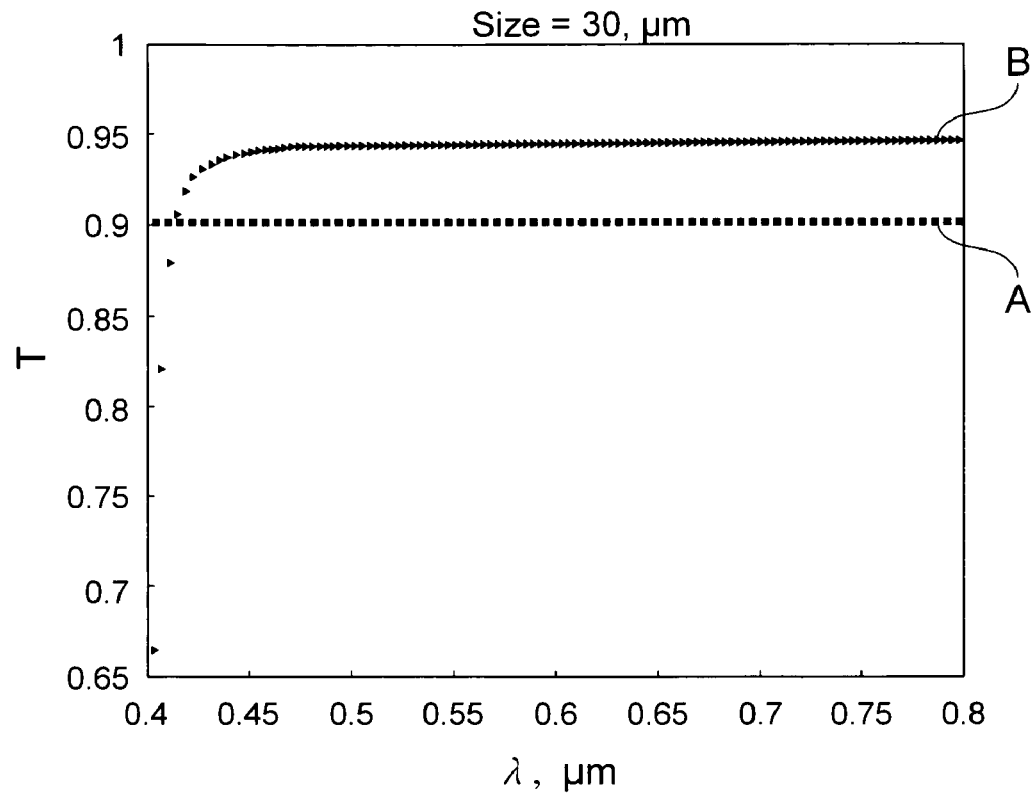
FIG. 8 is a graph showing light transmittance depending on wavelengths in a case where the size of spherical particles is set to 30 μm.

FIG. 7 is a graph showing light transmittance depending on wavelengths in a case where the size of the spherical particles is set to 10 µm, and FIG. 8 is a graph showing light transmittance depending on wavelengths in a case where the size of the spherical particles is set to 30 µm. In FIGS. 7 and 8, 'A' represents light transmittance of a structure with no light transmitting layer, and 'B' represents light transmittance of a structure with the light transmitting layer.

As shown in FIG. 7 where the light transmitting layer is formed of spherical particles with a diameter of 10 µm, when the wavelength of incident light is smaller than 0.45 µm, the light transmittance rapidly decreases. However, when the wavelength is larger than 0.55 µm, light extraction efficiency is enhanced by about 5%, compared with when the light transmission layer is not provided. In this case, the light transmittance is about 95%.

Further, as shown in FIG. 8, when the diameter of the spherical particles is set to 30 µm, it can be found that the light transmittance increases when the wavelength of incident light is larger than 0.425 µm.

As described above, the size of the spherical particles 160a has an effect upon the light transmittance depending on wavelengths.

Therefore, the size of the spherical particles 160a can be adjusted in various manners, depending on the wavelength of light transmitted to the outside.

Meanwhile, the light transmittance is determined by a ratio (r/h) of the radius (r) of the spherical particle 160a to the height (h) of the spherical particle 160a from the surface of the phosphor layer 160, that is, the height of the embossing pattern formed on the surface of the phosphor layer by the spherical particles.

Here, the light transmittance means a quantity of light transmitted to the outside through the phosphor layer, and may be considered as light extraction efficiency.

Figure 9:
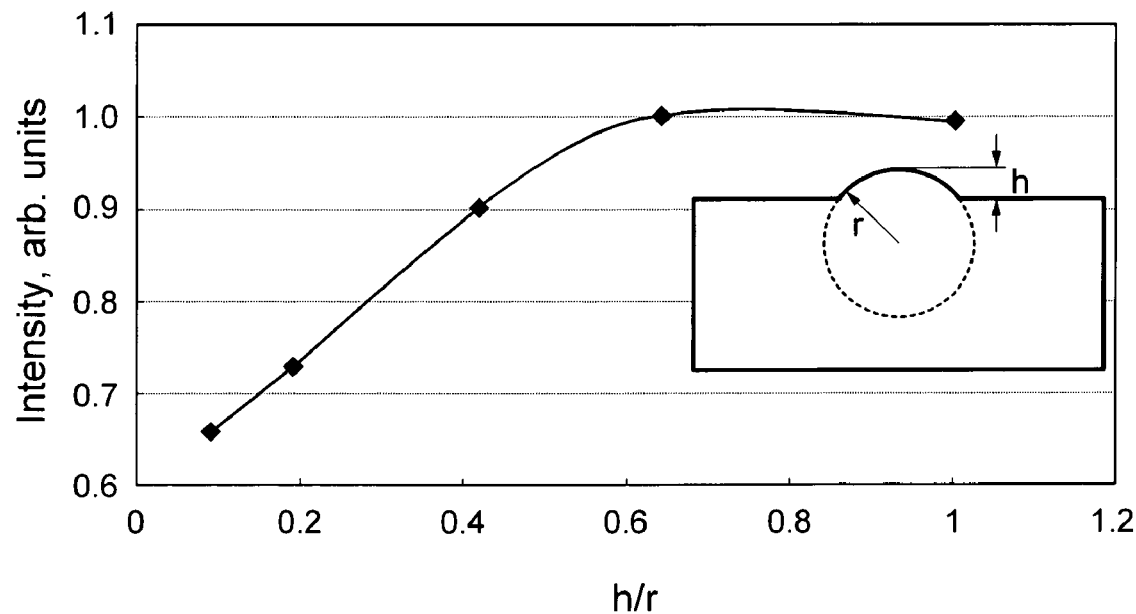
FIG. 9 is a graph showing light transmittance depending on a ratio of radius and height of particles.

FIG. 9 is a graph showing light extraction efficiency depending on the ratio (h/r) of the radius (r) of the spherical particle to the height (h) of the spherical particle from the surface of the phosphor layer, the light extraction efficiency being measured as the intensity of light. Here, FIG. 9 shows the intensity of light depending on a change in the height of the spherical particle from the surface of the phosphor layer, because the radius (r) of the spherical particle is constant.

As shown in FIG. 9, it can be found that as the height (h) increases, the intensity of light, that is, the light extraction efficiency increases. However, the light extraction efficiency does not continuously increase in accordance with the height (h) of the particle. When the ratio (h/r) of the height and the radius is 0.6, the light extraction efficiency is maximized. When the ratio exceeds 0.6, the light extraction efficiency slightly decreases.

Therefore, the light extraction efficiency can be adjusted by the radius of the spherical particle and the height of the spherical particle from the surface of the phosphor layer, that is, the height of the embossing pattern formed on the surface of the phosphor layer.

As described above, the white LED 100 has the light transmission layer 160 formed by implanting the spherical particles 160a into the surface of the phosphor layer 150 such that the embossing pattern is provided on the surface. Then, the critical angle at which the total reflection occurs is increased at the maximum such that light lost on the surface of the conventional phosphor layer by the total reflection is transmitted to the outside. Therefore, it is possible to increase the light extraction efficiency.

With the light transmitting layer 160 provided on the phosphor layer 150, it is possible to increase the light extraction efficiency by 5 to 30%, compared with when the light transmitting layer is not provided.

Meanwhile, the white LED 100 according to the invention is formed by the following process. First, the LED chip 110 is mounted on the bottom surface of the reflector cup 120. After the transparent resin 151 is filled by a jetting method such as dispensing or the like so as to surround the LED chip 110, the transparent resin 151 is cured to form the molding compound 130. Then, the phosphor layer 150 and the light transmitting layer 160 are consecutively formed on the molding compound 130.

Figure 10A:
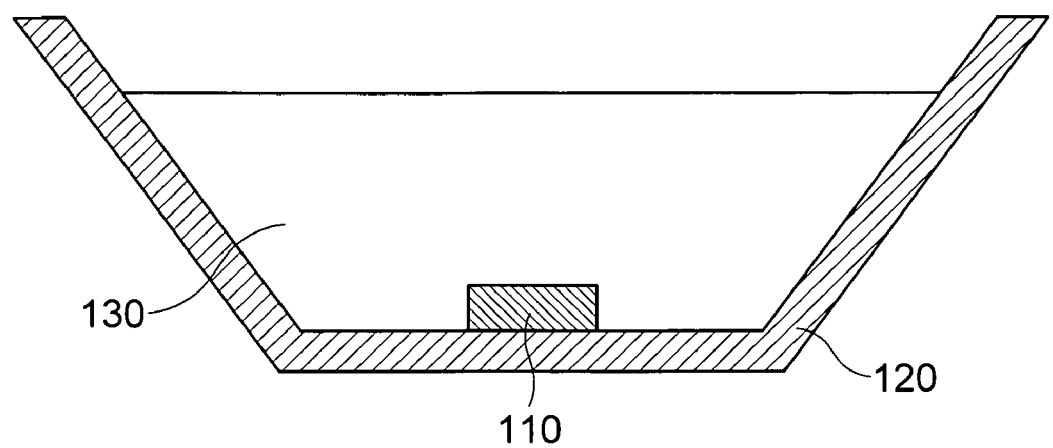
FIGS. 10A to 10C are process diagrams showing a method of manufacturing a white LED according to the invention.
Figure 10B:
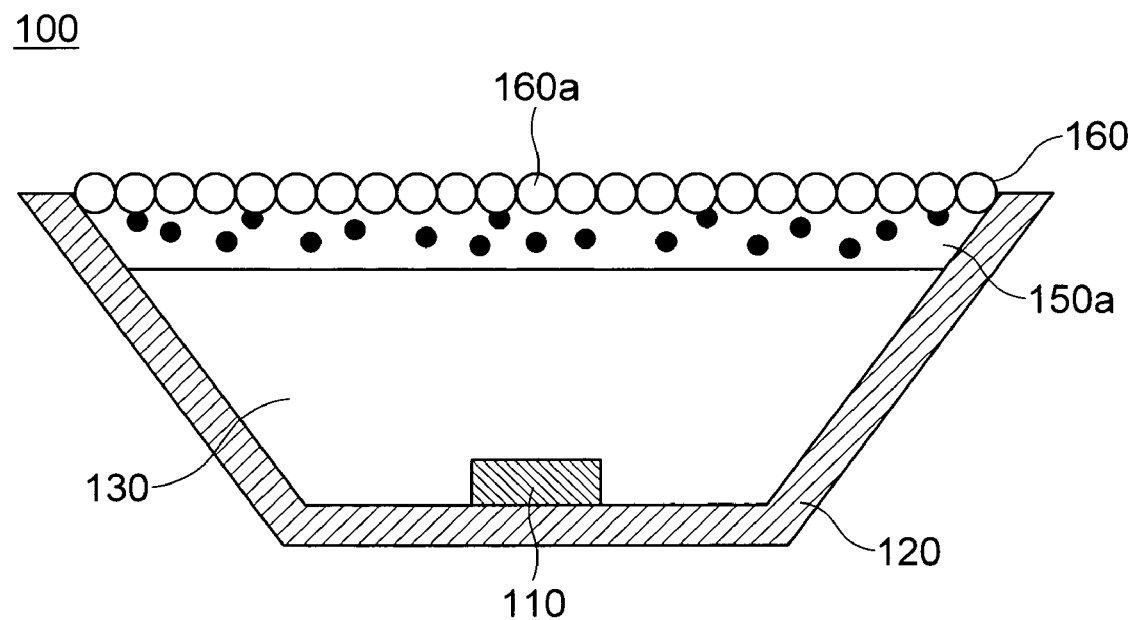
Figure 10C:
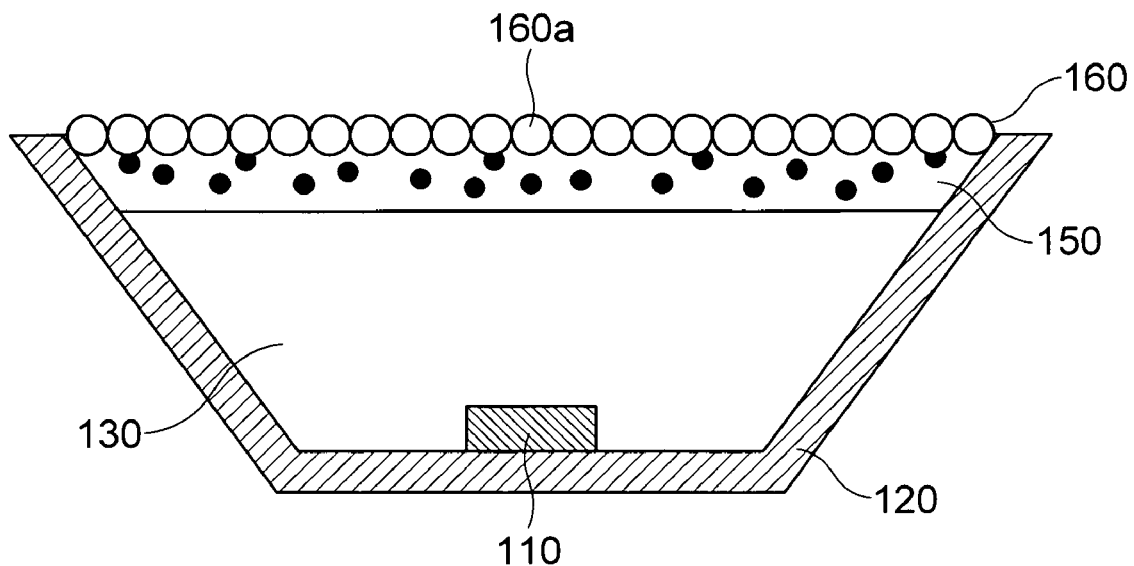

FIGS. 10A to 10C are process diagrams briefly showing a method of manufacturing a white LED according to the invention.

First, as shown in FIG. 10A, a reflector cup 120 is prepared, and an LED chip 110 is mounted on the reflector cup 120. At this time, the inner surface of the reflector cup 120 may be coated with a reflective material such as silver (Ag) or aluminum (Al) for reflecting light incident on the reflector cup 120 from the LED chip 110 such that the light is directed upward.

Continuously, transparent resin is filled by a jetting method such as dispensing or the like so as to surround the LED chip 110 and is then cured to form a molding compound 130.

The transparent resin 151 may be formed of any one of PMMA, polysterene, polyurethane, benzoguanamine resin, epoxy, and silicon resin.

As shown in FIG. 10B, resin obtained by mixing transparent resin with phosphor materials is coated on the molding compound 130 and is then semi-cured. After that, spherical particles 160a are inserted into the surface of the semi-cured phosphor layer 150a, thereby forming a light transmitting layer 160 on which an embossing pattern is formed.

The spherical particles 160a are formed to have the same refractive index as the molding compound 130 and may be formed of any one of PMMA, polysterene, polyurethane, benzoguanamine resin, epoxy, and silicon resin.

The inserting of the spherical particles 160a into the surface of the semi-cured phosphor layer 150a is performed as follows. A sheet for bonding the spherical particles is prepared, and is then pressed against the semi-cured phosphor layer 150a to insert the spherical particles.

Figure 11A:
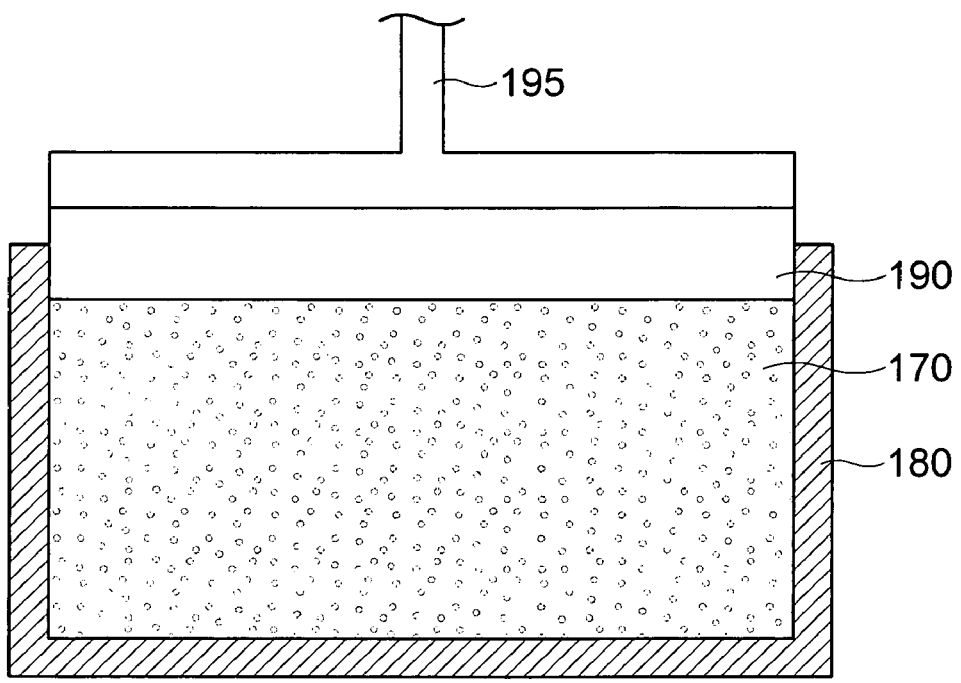
FIGS. 11A to 11C are process diagrams showing a process of forming a light transmitting layer according to the invention.
Figure 11B:
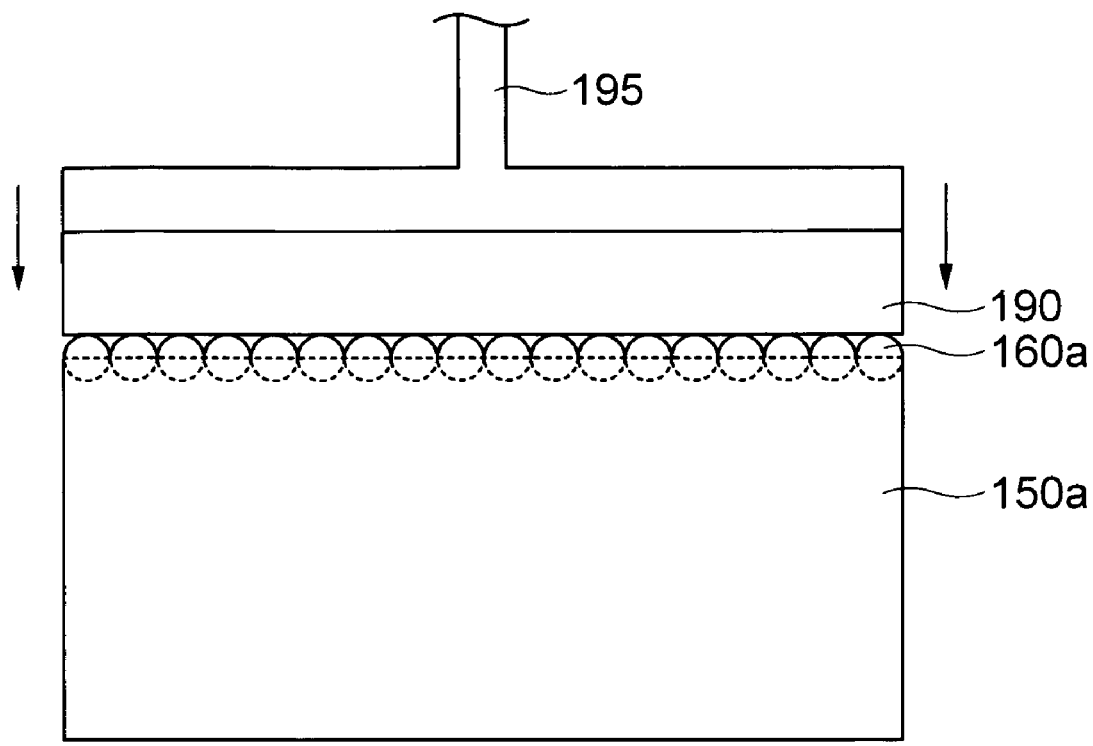
Figure 11C:
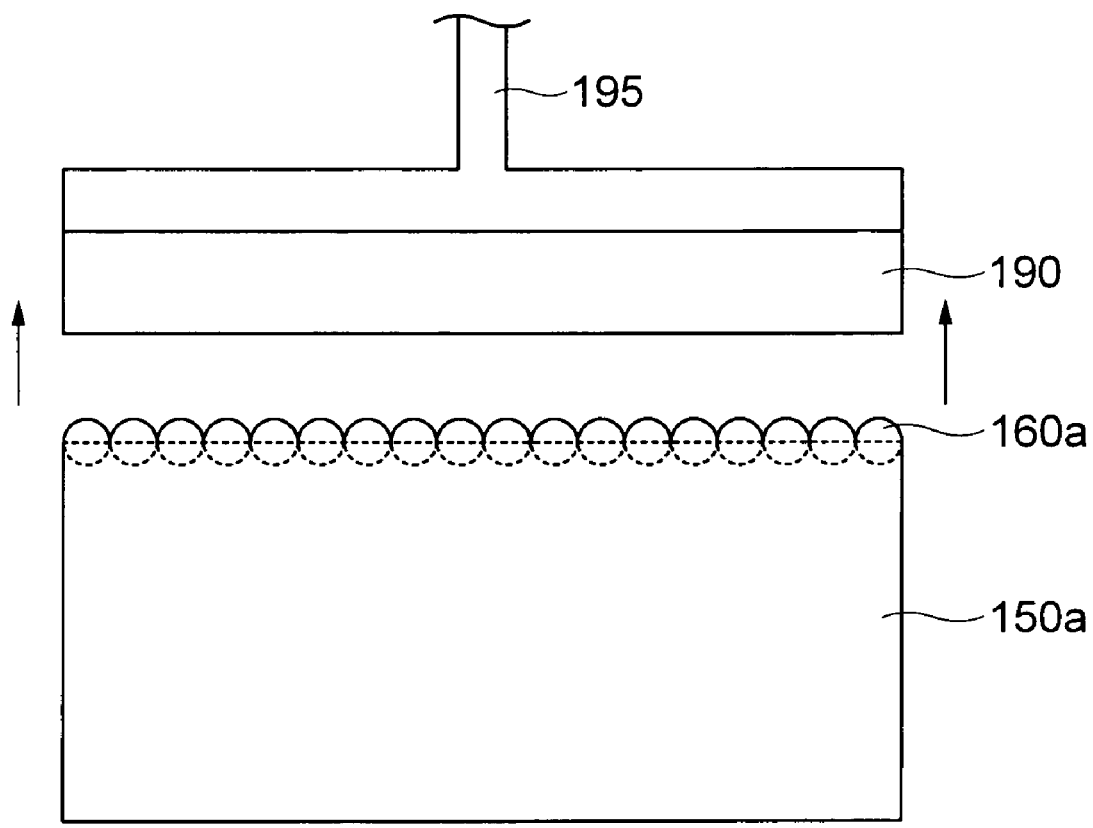

FIGS. 11A to 11C are diagrams showing the method for inserting the spherical particles 160a. First, as shown in FIG. 11A, a container 180 in which spherical-particle powder 170 is stored and a support bar 195 having a sheet 190 which can bond the spherical-particle powder are prepared. At this time, the sheet 190 may be formed of cloth or sponge.

Then, as the sheet 190 is put into and taken out of the container 180, the spherical-particle powder 170 is bonded to the surface of the sheet 190. At this time, the spherical-particle powder 170 may include spherical particles having a diameter of 5 to 100 μm.

Continuously, as shown in FIG. 11B, the sheet 190 to which the spherical-particle powder is bonded is contacted with the semi-cured phosphor layer 150*a*, and predetermined pressure is applied to implant the spherical particles 160*a* into the surface of the phosphor layer 150. At this time, since a depth at which the spherical particles 160*a* are implanted into the surface of the phosphor layer 150 is determined by the pressure applied to the sheet 190, the pressure should be applied in such a manner that the spherical particles 160*a* are not completely buried into the phosphor layer 150.

Next, as shown in FIG. 11C, when the sheet 190 is separated from the phosphor layer 150*a*, the spherical particles 160*a* implanted into the surface of the phosphor layer 150*a* remain as they are.

This can be realized because since the phosphor layer 150*a* is semi-cured, the bonding force of the phosphor layer caused by the viscosity of the transparent resin of the phosphor layer is larger than that of the sheet.

After the spherical particles 160*a* are inserted into the semi-cured phosphor layer 150*a*, the phosphor layer 150 is completely cured. Then, as shown in FIG. 10C, the white LED 100 is formed.

The white LED 100 obtained by the above-described method according to the invention transmits all light, generated from the phosphor layer 150, to the outside through the light transmitting layer 160 by using the light emitted from the LED chip 110 as an excitation source, thereby enhancing the light extraction efficiency.

The basic concept of the invention is that the spherical particles are inserted into the surface of the phosphor layer so as to form the light transmitting layer having an embossing pattern formed thereon. If the basic concept is included regardless of a mounting method for LED, a packaging method and so on, all white LEDs belong to the invention.

According to the invention, as the spherical particles are inserted into the phosphor layer such that the embossing pattern is formed on the surface of the phosphor layer, the critical angle at which the total reflection occurs is increased. Therefore, phosphorescence which is generated from the phosphor layer so as to be discharged downward is transmitted to the outside, thereby enhancing light extraction efficiency.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A white light emitting diode (LED) comprising:
a reflector cup;
an LED chip mounted on a bottom surface of the reflector cup;
transparent resin surrounding the LED chip;
a phosphor layer formed on the transparent resin; and
a light transmitting layer having an embossing pattern formed on the phosphor layer in a manner such that the embossing pattern covers an upper surface of the phosphor layer, the light transmitting layer transmitting light therethrough, incident from the phosphor layer, in an upward direction,
wherein the embossing pattern comprises a plurality of spherical particles made of a same material as that of the transparent resin and having diameters of about 5 to about 100 μm,
wherein the spherical particles forming the light transmitting layer are disposed above the transparent resin and separated therefrom by the phosphor layer interposed between the light transmitting layer and the transparent resin,
wherein a ratio of the radius of the spherical particles to a height of the embossing pattern from the surface of the phosphor layer is 0.6 or more.

2. The white LED according to claim 1, wherein the transparent resin is selected from the group consisting of polymethyl methacrylate (PMMA), polystyrene, polyurethane, benzoguanamine resin, epoxy, and silicone resin.

3. The white LED according to claim 1, wherein the phosphor layer is formed by mixing transparent resin and phosphor materials.

4. The white LED according to claim 3, wherein the transparent resin is selected from the group consisting of PMMA, polystyrene, polyurethane, benzoguanamine resin, epoxy, and silicone resin.

5. The white LED according to claim 1, wherein the LED chip includes at least one or more LEDs which generate blue, red, green, and ultraviolet (UV) wavelengths.

6. The white LED according to claim 1, wherein the phosphor layer includes at least one or more phosphor materials which convert a wavelength into anyone of yellow, red, and green.

7. A white LED comprising:
a reflector cup that is inclined upward;
an LED chip that is mounted on a bottom surface of the reflector cup;
a molding compound that is filled in the reflector cup so as to surround the LED chip;
a phosphor layer that is formed on the molding compound; and
a light transmitting layer having an embossing pattern formed on the phosphor layer in a manner such that the embossing pattern covers an upper surface of the phosphor layer, the embossing pattern comprising a plurality of spherical particles, the spherical particles being made of a same transparent material as that of the molding compound and having diameters of about 5 to about 100 μm,
wherein the spherical particles forming the light transmitting layer are disposed above the molding compound and separated therefrom by the phosphor layer interposed between the light transmitting layer and the molding compound,
wherein a ratio of the radius of the spherical particles to a height of the embossing pattern from the surface of the phosphor layer ranges from 0.6 to 1.

8. The white LED according to claim 7, wherein the light transmitting layer is formed of anyone selected from the group consisting of PMMA, polystyrene polyurethane, benzoguanamine resin, epoxy, and silicone resin.

* * * * *